United States Patent [19]

Teng et al.

[11] Patent Number: 4,890,144
[45] Date of Patent: Dec. 26, 1989

[54] INTEGRATED CIRCUIT TRENCH CELL

[75] Inventors: Ker-Wen Teng; Karl L. Wang; Bich-Yen Nguyen, all of Austin; Wei Wu, Round Rock, all of Tex.

[73] Assignee: Motorola, Inc., Schaumburg, Ill.

[21] Appl. No.: 95,809

[22] Filed: Sep. 14, 1987

[51] Int. Cl.[4] ............................................. H01L 23/48
[52] U.S. Cl. ..................................... 357/23.4; 357/41; 357/55; 357/51; 365/182
[58] Field of Search ................... 357/23.4, 55, 41, 51; 365/182, 154

[56] References Cited

U.S. PATENT DOCUMENTS

| 4,630,237 | 12/1986 | Miura | 357/41 |
| 4,651,184 | 3/1987 | Malhi | 357/23.6 |
| 4,673,962 | 6/1987 | Chatterjee et al. | 357/23.6 |
| 4,683,643 | 8/1987 | Nakajima et al. | 437/203 |
| 4,686,552 | 8/1987 | Teng | 357/55 |
| 4,689,871 | 9/1987 | Malhi | 437/40 |
| 4,704,705 | 11/1987 | Womack | 365/149 |
| 4,713,678 | 12/1987 | Womack | 357/55 |
| 4,794,561 | 12/1988 | Hsu | 365/182 |

FOREIGN PATENT DOCUMENTS

| 58-003269 | 1/1983 | Japan . | |
| 59-107563 | 6/1984 | Japan | 357/41 |

OTHER PUBLICATIONS

F. Masuoka, et al., "A New High Density Full CMOS SRAM Cell using Polysilicon Interconnection Structure," IEDM Technical Digest, 1985, pp. 280–283.

Primary Examiner—Andrew J. James
Assistant Examiner—Mark Prenty
Attorney, Agent, or Firm—John A. Fisher

[57] ABSTRACT

A multiple element integrated circuit trench cell having at least one vertical field effect transistor (FET) in a wall of a trench in a semiconductor substrate. The cell further comprises a central load device within the trench which is electrically connected to the vertical FET. The central load device may be an active load device, such as another field effect transistor, or a passive load device, such as a resistor. Additionally, a further FET may be present in another wall of the trench or in a lateral orientation adjacent the trench in the semiconductor surface. Two of these multiple element trench cells may be interconnected in various configurations to form conventional static random access memory (SRAM) cells.

19 Claims, 10 Drawing Sheets

INTEGRATED CIRCUIT TRENCH CELL

FIELD OF THE INVENTION

The invention relates to integrated circuit elements formed in trench structures and particularly relates to trench integrated circuits where at least one transistor is formed in the trench.

BACKGROUND OF THE INVENTION

As the integrated circuit industry has explored ways of packing more circuits onto a given semiconductor substrate, more effort has been devoted to not only orienting the various devices in a planar fashion along the surface of the substrate, but also to orienting the devices vertically either by building the devices up from the substrate surface or by burying the devices in trenches formed within the face of the semiconductor body.

For example, a number of schemes for isolating customary planar devices with trench isolation regions are now known. Trench capacitors are also being employed on a commercial basis on the largest memory chips, such as 1-Mbit and 4-Mbit DRAMs.

Trench-like transistors have been employed in various forms. One of the earliest forms of a "trench-type" transistor uses various layers of semiconductive material to form a stack of a source/drain region covered by a layer that serves as a channel region and a top layer that serves as the other source/drain region. A groove or trench is cut through this stack. The groove or trench is coated or covered with a thin dielectric material which serves as the gate dielectric, and the remainder of the trench is filled with a conductive material plug which serves as a gate.

Other configurations employ a shallower trench-type structure or V-shaped groove where the trench or groove not only is coated or covered with a thin dielectric layer which serves as the gate dielectric, but which dielectric is further coated with a thin layer of conductive material to form the gate electrode; at least thin relative to the plug-type gate configurations. Also of interest in relationship to these types of structures are V-MOS devices with self-aligned multiple electrodes. Vertical CMOS transistors that are built up from the surface of the semiconductor wafer rather than buried into the substrate are also known, along with vertical FETs built into trenches where the gate is a thin layer inside the trench separated from another gate within the same trench by some sort of structure. Other proposed vertical FETs include a structure where a trench contains a cylindrical gate and one source/drain is positioned at the bottom of the trench with its contact running through the middle of the cylindrical gate. Also being investigated are trench-type structures which incorporate both transistors and capacitors into the trenches in some manner.

From the above brief history, it is noted that more complex devices are being designed for trench manufacture. As noted, the present challenge for trench technology involves placing more than one device in the same trench, such as a transistor and other element to form a dynamic or static random access memory (DRAM or SRAM) memory cell.

Nevertheless, as trench technology is still developing, a need exists for additional trench structures, particularly of the newer, multiple device type, so that the best alternatives may be made available and considered in the fabrication of extremely high density integrated circuits. Very few of the proposed trench structures have actually been implemented in commercial integrated circuit chips. There is a need for future SRAM cells employing the new trench technologies, particularly those which provide a low soft error rate (SER).

SUMMARY OF THE INVENTION

Accordingly, it is an object of the present invention to provide a memory cell for a SRAM employing multiple elements, which may be transistors.

Another object of the invention is to provide a multiple element SRAM cell capable of having either an active or a passive load formed therein.

It is another object of the present invention to provide a multiple element trench SRAM cell that minimizes substrate surface area and the soft error rate of the memory of which it is a part.

Still another object of the present invention is to provide a vertical trench transistor cell requiring no extra isolation space between the elements therein.

In carrying out these and other objects of the invention, there is provided, in one form, an integrated circuit cell formed in a substrate with a trench, when the trench has at least one vertical wall, and a bottom floor, where the vertical wall has a top portion. The cell also has at least one field effect transistor (FET) in the vertical wall, wherein the FET has two source/drain regions, one near the top portion of the wall and one in the bottom floor of the trench. The FET also has a gate region along the wall. The cell also contains a central load device within the trench, where the central load device has top and bottom contacts, wherein the bottom contact of the load device is electrically connected to the FET in the vertical wall.

It will be appreciated that the cross-section illustrations of the invention are not to scale, and that often the vertical proportions are exaggerated relative to the horizontal proportions for clarity.

DETAILED DESCRIPTION OF THE INVENTION

Figure 1:
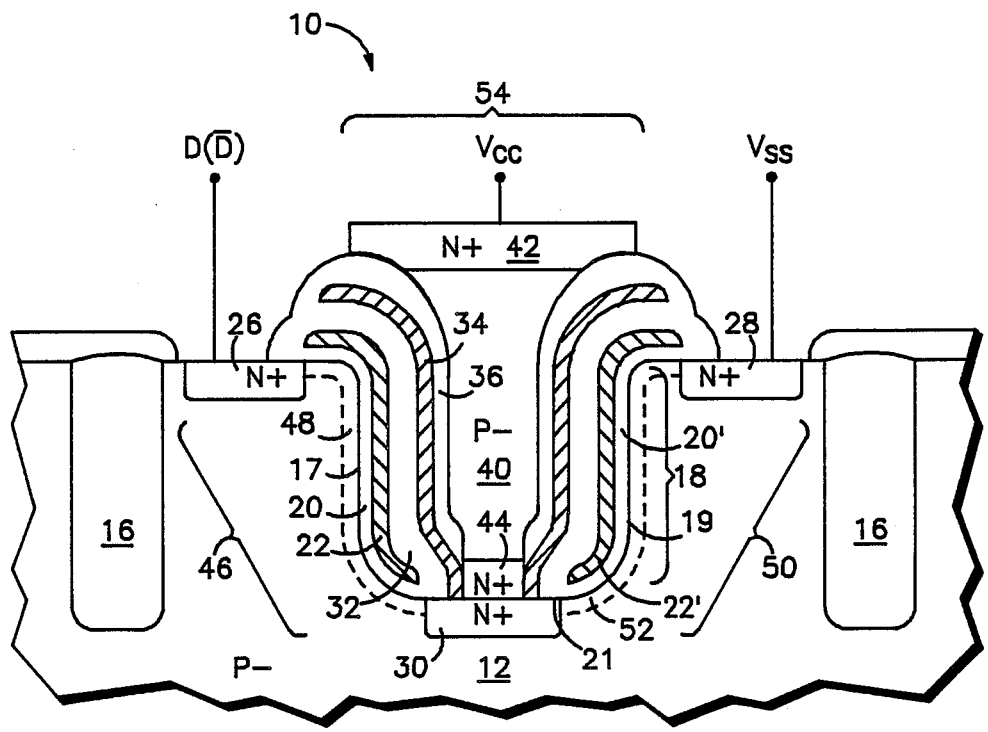
FIG. 1 is a cross-section illustration of one embodiment of the SRAM memory cell of this invention employing three transistors in a trench.

Shown in FIG. 1 is a cross-section of one embodiment of the cell 10 of this invention that may be employed in very large scale integration (VLSI) or ultra large scale integration (ULSI) circuit SRAMs or other circuits. The cell 10 is fabricated in a semiconductor substrate 12, which may be, but is not limited to, monocrystalline silicon or other suitable material. Isolation regions 16 are provided to surround the active regions where the cell 10 resides.

Semiconductor substrate 12 will be taken in this description to be $p^-$ doped, although it will be appreciated that the substrate may be of the opposite conductivity type, and that the other doped semiconductor material regions may also be reversed. The substrate 12 has a trench 18 therein which has at least two walls 17 and 19 and a bottom floor 21. The cell 10 has at least two field effect transistors (FETs). First FET 46 has a source/drain region 26 near the top portion of wall 17 and a drain/source region 30 in the bottom floor 21 of trench 18, separated by a channel 48. Over channel 48 is thin gate dielectric layer 20 which in turn is covered by gate 22.

Second FET 50 has drain/source region 30 in common with FET 46 and another source/drain region 28 separated from drain/source region 30 by channel 52. Channel 52 is covered by thin gate dielectric layer 20' and the FET 50 gate is 22'. As will be explained during the process flow description, the layers forming gates 22 and 22' and dielectric layers 20 and 20' are originally one and are etched apart during processing to provide contact for the third FET 54.

Third FET 54 functions as the load on the cell 10 herein and has source/drain region 42 at the top of the cell 10 separated from drain/source region 44 at the bottom 21 of the cell 10, separated by channel 40. The gate dielectric for cylindrically-shaped load FET 54 is thin gate dielectric layer 36 under which is gate electrode 34. Note that drain/source region 44 is directly connected to gate 34 as well as drain/source region 30 of FETs 46 and 50.

Figure 4:
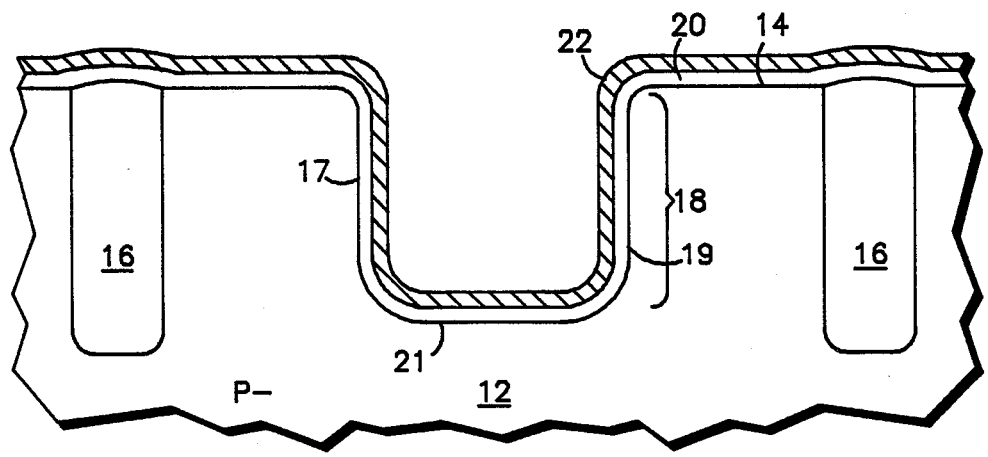
FIG. 4 is a cross-section illustration of a trench early in the stages of fabrication of a trench cell of this invention.

The construction of the cell 10 in FIG. 1 will now be discussed. Shown in FIG. 4 is an early step in the fabrication of the multiple transistor cell 10 of the invention, particularly the embodiment shown in cross-section in FIG. 1. The fabrication process begins by providing a semiconductor substrate 12 having a surface 14 into which are provided isolation regions 16 surrounding the active areas of the cell 10 to isolate the various cells 10 from each other. The isolation structures 16 may be silicon oxide, silicon nitride, undoped polysilicon or combinations thereof, or other suitable material. Further, the isolation structures 16 may be provided by any conventional process, such as local oxidation of silicon (LOCOS), sealed interface local oxidation (SILO), or by trench isolation, etc. If trench isolation is employed, as is recommended since the cell will also be built into a trench, the trench should be about the same depth, or about 3 microns deep and approximately 0.5 to 1 micron wide.

A trench 18 is etched via generally anisotropic etch techniques, such as plasma etching or reactive ion etching (RIE) in the surface 14 of substrate 12. It is recommended that the etch process to form trench 18 be one which rounds both the top and bottom corners of the trench 18 to facilitate conformal layer coverage. The trench should have at least two walls 17 and 19, and a bottom floor 21. Although the trench may be of any dimensions or proportions, one size might be a trench approximately 2 to 3 microns deep by about 2.0 to 3.0 microns wide. The first layer to be formed is a first thin gate dielectric layer 20 which may be silicon dioxide, silicon nitride or a combination of the two, such as an oxide-nitride-oxide (ONO) sandwich. Next, a conductive material layer 22, such as doped polycrystalline silicon (polysilicon or poly), a metal or metal silicide is conformally provided over dielectric layer 20. For the purposes of this example, it will be assumed that this first conductive material layer is in situ doped polysilicon of $n^+$ conductivity type.

Figure 5:
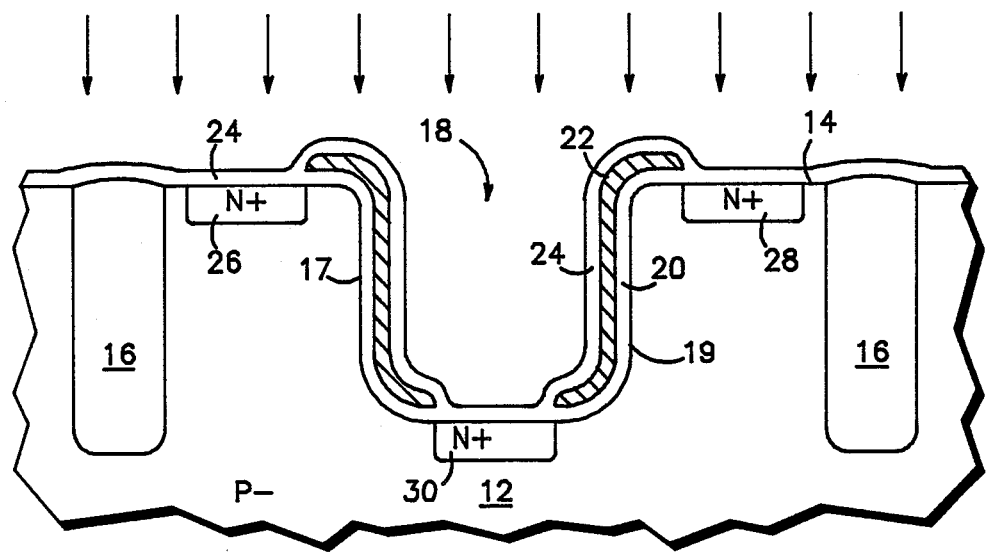
FIG. 5 is a cross-section illustration of the trench of FIG. 4 after the source/drain regions of the transistors have been formed.

Layers 20 and 22 are patterned and etched to provide openings for forming source/drain regions, and a thin pad dielectric 24 such as silicon dioxide is provided if the source/drain regions are to be incorporated by ion implantation as illustrated in FIG. 5. The ion implantation may be performed conventionally. Since $n^+$ source/drain regions are to be formed, phosphorus or arsenic, in elemental or compound form, may be used. The $n^+$ source/drain regions formed include regions 26 and 28 near the top portions of walls 17 and 19 respectively, and drain/source region 30 in the bottom floor 21 of the trench 18. Note that regions 26, 28 and 30 may be self-aligned to gate layer 22. Typically, the implanted impurities should be annealed to fully form source/drain regions 26, 28 and 30.

Figure 6:
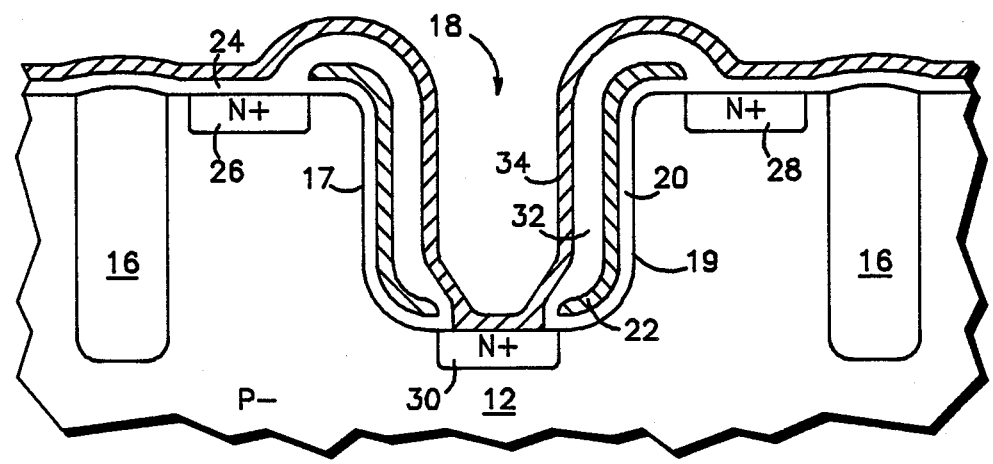
FIG. 6 is a cross-section illustration of the trench capacitor of FIG. 5 after application of the second conductive layer.

Next, an oxidation is performed to provide thick dielectric isolation layer 32, as shown in FIG. 6. This layer may be formed on top of the thin ion implantation pad 24, or may be provided after the pad 24 is removed by some conventional etching means. Thick dielectric isolation region 32 may again be silicon dioxide, silicon nitride, combinations thereof, etc. This region 32 should be patterned at the bottom of the trench to enable contact to drain/source region 30, and then second conductive material layer 34 is formed to give the structure shown in FIG. 6. Second conductive material layer 34 may be formed of any of the materials suggested for first conductive material layer 22. For the example being discussed, second conductive material layer 34 is considered to be n+ polysilicon that is deposited by chemical vapor deposition (CVD). This process is known to give a conformal layer.

Figure 7:
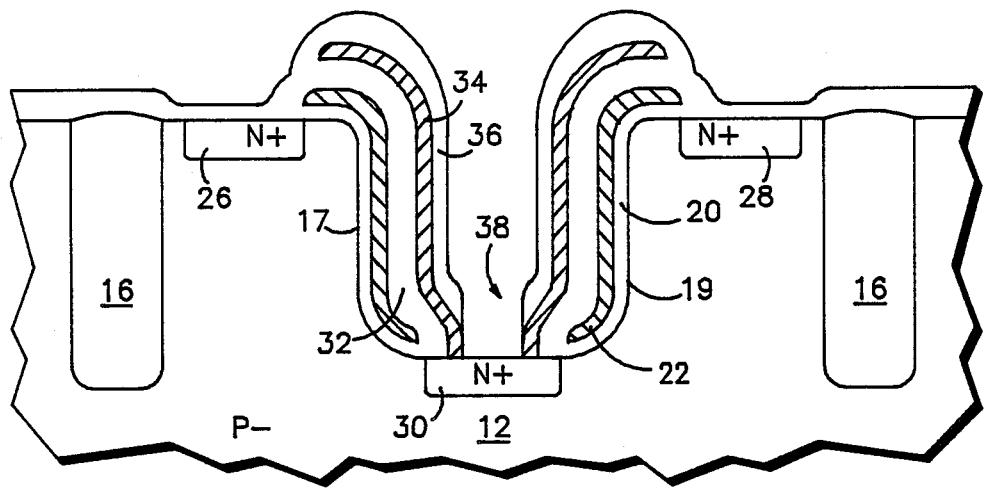
FIG. 7 is a cross-section illustration of the trench cell of this invention in an intermediate stage of construction between that shown in FIG. 6 and that shown in FIG. 1.

Next, as shown in FIG. 7, a second thin gate dielectric layer 36, such as silicon dioxide, is placed over the second conductive material layer 34. Second conductive material layer 36 may or may not be etched to a pattern at this point, depending on how the device engineer wishes to isolate it from the rest of the circuit. In any event, both thin gate dielectric layer 36 and second conductive material layer 34 need to be patterned to provide opening 38, as seen in FIG. 7.

The remainder of trench 18 is filled by a semiconductive material layer or plug 40, which may be polysilicon. Refer to FIG. 1. However, in this case, it may be desirable for the plug 40 to be in situ doped pCVD polysilicon since plug 40 will form the channel for the central load device which in this embodiment will be a transistor. A separate layer of CVD in situ doped n+ poly 42 is placed on top of polysilicon plug 40 as one of the source/drain regions 42. The connection to the bottom of plug 40 is provided by an anneal which would diffuse enough impurity from drain/source region 30 and second conductive material layer 34 into the bottom region 44 of plug 40 to make the contact. The conductive materials that formed plug 40 and n+ source/drain region 42 should be patterned and etched to limit it to the trench area. Alternatively, it may be possible to use a plug fill technique and n+ implantation step to form regions 40 and 42 in trench 18 without employing masking and patterning etch steps. Interconnect layers and dielectric layers may be formed and etched at this point and vias or openings to source/drain regions 26 and 28 should be provided. The process up to this point gives the essentially finished cell shown in FIG. 1. Other conventional processing steps, such as providing a passivation layer and interconnection formation, may be performed as needed.

Figure 2:
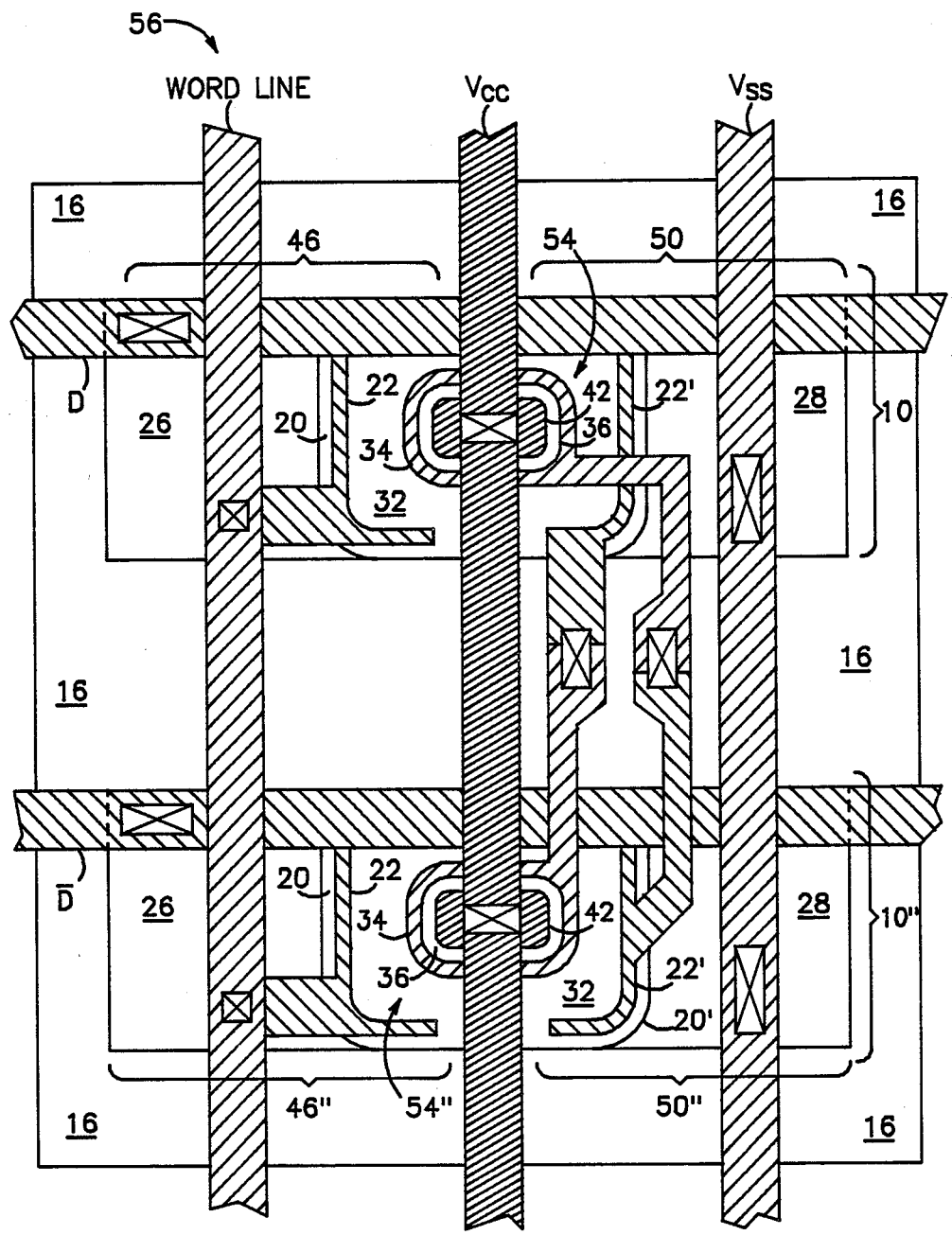
FIG. 2 is a rough, overhead layout of the SRAM memory cell of FIG. 1.

Shown in FIG. 2 is an overhead or layout schematic of the cell 10 in FIG. 1. It will be appreciated that this is only one possible layout and is not an optimized layout, nor is it even a practical one. However, it is provided to illustrate how two cells 10 and 10" might appear and be connected to form a six-transistor SRAM cell 56 where two of the multiple transistor cells 10 and 10" are interconnected. For example, it may be seen that source/drain regions 26 of FETs 46 and 46" are connected to bit lines D and inverse bit line D, respectively. The gates 22 of these FETs 46 and 46" are both connected to the word line. As noted earlier, the other drain/source regions 30 of FETs 46 and 46" are at the bottom of the trench and thus not visible in FIG. 2.

Figure 3:
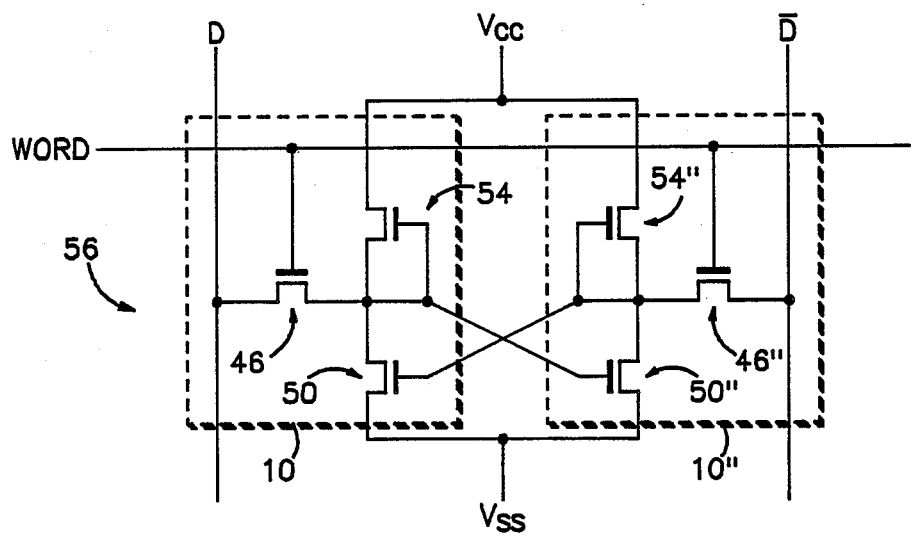
FIG. 3 is a schematic circuit diagram of a conventional six transistor SRAM memory cell for illustrating how the transistors of the SRAM cell embodiment in FIG. 1 would be connected and configured to form the entire cell.

Again, with respect to FETs 50 and 50", one of the source/drain regions thereof 30 is buried and not visible. The other source/drain regions 28 are both connected to $V_{ss}$, while the gate 22' of FET 50 is connected to the gate 34 of vertical FET 54". Similarly, the gate 22' of FET 50" is connected to the gate 34 of vertical FET 54. Finally, the top source/drain regions 42 of both vertical FETs 54 and 54" are connected to $V_{cc}$ line as shown in FIG. 2. Shown in FIG. 3 is a schematic circuit diagram of the two multiple transistor cells 10 and 10" in the SRAM cell 56, simplified from FIG. 2. The six transistor SRAM cell 56 is known in the art. However, its particular structural embodiment into two trenches 18 is new. The operation of the six transistor SRAM cell is well known in the art, and not being the subject of the present invention, is omitted herein for brevity. Typically, devices 54 and 54" are load devices and may be other devices besides transistors. For example, in the embodiment of the invention illustrated in cross-section in FIG. 8, these load devices are resistors and not transistors.

Figure 8:
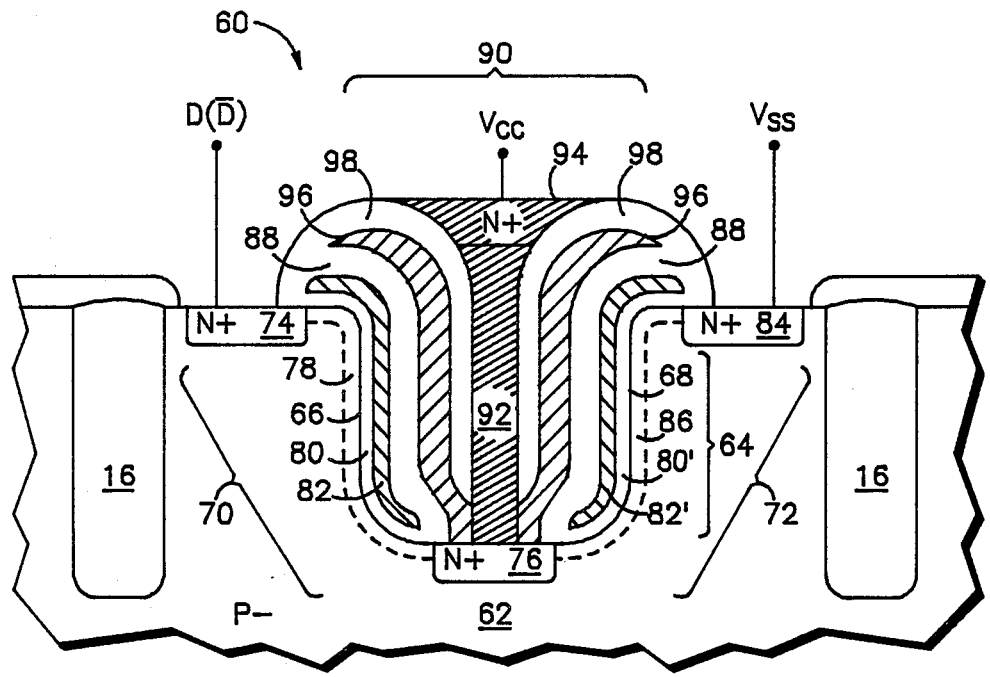
FIG. 8 is a cross-section illustration of another alternate embodiment of the present invention that utilizes two transistors, a resistor and an interconnect layer.

Shown in FIG. 8 is another embodiment of the present multiple transistor cell 60 invention in semiconductor substrate 62. Cell 60 has a trench 64 with at least two walls 66 and 68, which in turn bear first FET 70 and second FET 72, respectively. FET 70 has source/drain region 74 in the top portion of wall 66. This n+ source/drain region 74 may be a layer in the surface of substrate 62 that has been formed in or added thereto. The other drain/source region 76 may be a buried layer, or other type of layer formed by conventional means. The FET 70 source/drain regions 74 and 76 are separated by channel 78. Channel 78 is covered by thin dielectric layer 80 (analogous to layer 20 in FIG. 1) over which is positioned the gate electrode 82 for FET 70.

Similarly, second FET 72 has a source/drain region 84 in the substrate 62 surface near the top portion of wall 68 which is separated from the buried drain/source region 76 by channel 86. The channel 86 is covered by thin gate dielectric 80', which is in turn covered by gate electrode 2'. The gate electrodes 82 and 82' are separated from interconnect region 96 by means of thick dielectric layer 88. Source/drain region 84, drain/source region 76 and source/drain region 74 may be formed by impurity introduction in a manner like that used in the embodiment of FIG. 1, for example, by ion implantation or diffusion.

Another feature apparent in the embodiment of FIG. 8 is the presence of another layer of polysilicon 96 somewhat analogous to second conductive material layer 34 in the embodiment of FIG. 1. In the adaptation of this cell 60 to the circuit in FIG. 9 as will be described later, it becomes apparent that there is a need for a means to connect resistor contact 76 with the gate 82 of a transistor 72 of an adjacent cell 60". This layer 96 facilitates that connection. Thus, it is apparent that dielectric layer 88 should also be present and that there should be a dielectric layer 98 to isolate the bulk of resistor 90 from this second conductive layer 96. Dielectric layer 88 should be at least thick enough so that current flow in conductor 96 does not create sufficient field strength in channels 78 or 86 to induce carrier flow in FETs 70 and 72, respectively.

In the present embodiment shown in FIG. 8, load device 90 is a resistor formed by n-doped polysilicon plug 92 between drain/source connection 76 and top n+ electrode 94, which is connected to Vcc. Source/drain region 74 is connected to bit lines or data lines D and inverse D, while source/drain region 84 is connected to $V_{ss}$. It will be appreciated by those skilled in the art that the embodiment of FIG. 8 can be made according to the processes described for the embodiment of FIG. 1.

Figure 9:
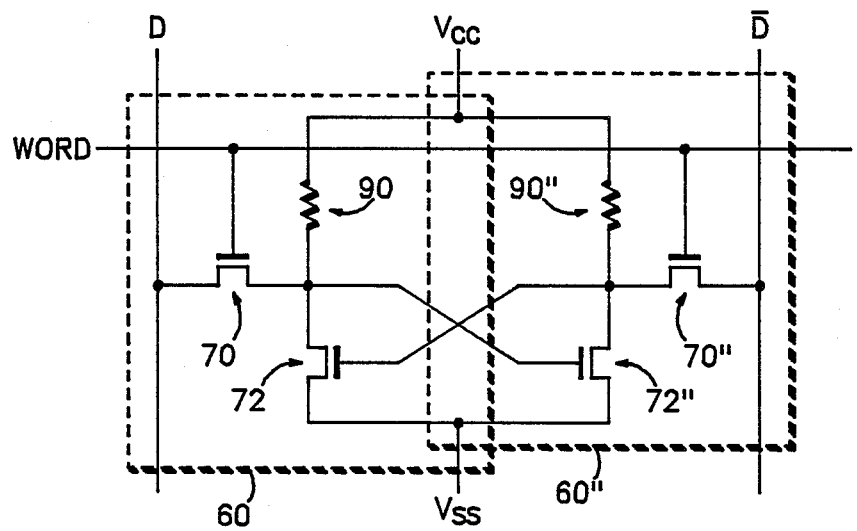
FIG. 9 is a schematic circuit diagram of the conventional four transistor and two resistor SRAM cell illustrating how the alternate embodiments of FIG. 8 may be connected.

Shown in FIG. 9 is a schematic circuit diagram of how two of the multiple transistor cells 60 and 60" may be interconnected to form a four-transistor, two-resistor SRAM cell. Again, the particular circuit shown in FIG. 9 is well known in the art, although its structural implementation herein is new. Similarly to the discussion of FIG. 3, source/drain 74 of cell 60 is connected to bit line D while source/drain 74 of cell 60" is connected to inverse bit line D. The other source/drain regions of the cells are connected to the gates of the other transistors of the opposite cells; drain/source region 76 of cell 60 is connected via conductive layer 96 to gate 82' of FET 72", and drain/source region 76 of cell 60" is connected via conductive layer 96 to gate 88 of FET 72. Source/drains 76 of both cells 60 and 60" are, of course, also connected to the bottom contact of resistors 90 and 90" and serve as one source/drain region for transistors 72 and 72", respectively. Source/drain regions 84 of transistors 72 and 72" are both connected to $V_{ss}$, while the top contacts 94 of resistors 90 and 90" are both connected to $V_{cc}$.

Figure 10:
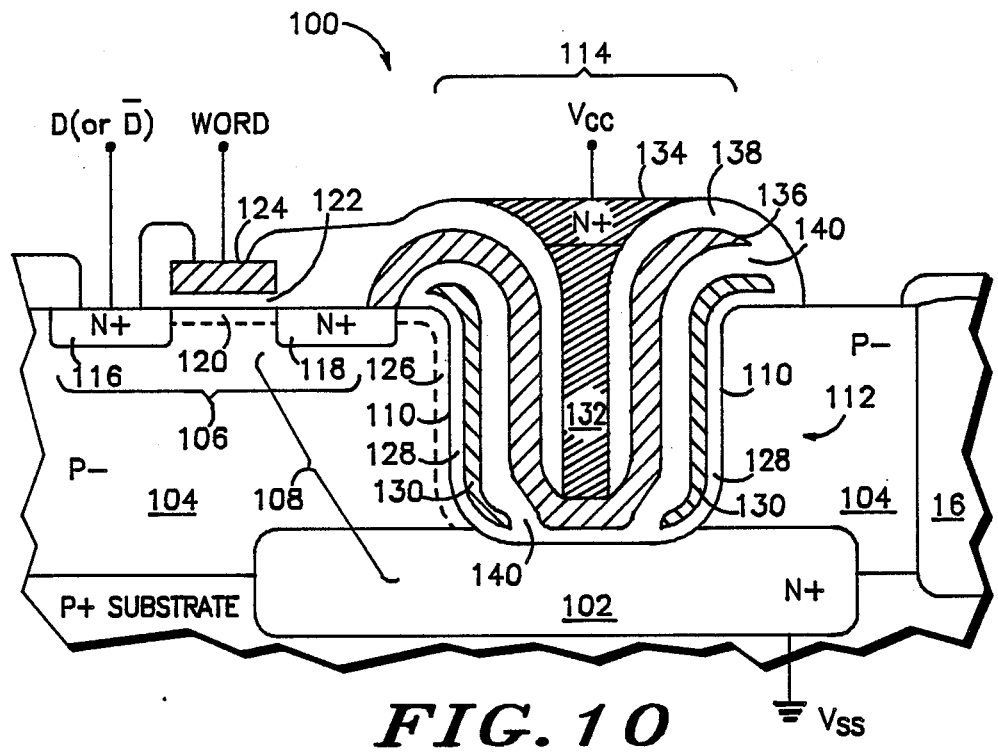
FIG. 10 is a cross-section illustration of another embodiment which employs a buried layer to make a two transistor, one resistor unit for an SRAM memory.

Shown in FIG. 10 is still another embodiment of the present invention, a VLSI or ULSI memory cell 100 using a polysilicon resistor load buried in a trench structure on a p⁻ wafer with a n+ buried layer 102.

In this embodiment the cell comprises two FETs, a lateral FET 106 and a vertical FET 108 in the vertical wall 110 of trench 112 which also houses the load device 114, which in the case illustrated in FIG. 10 is a passive load device such as a resistor. Lateral FET 106 has source/drain region 116 and drain/source region 118, the latter of which is situated in the surface of p⁻ layer 104 near the top portion of wall 110. Source/drain regions 116 and 118 are spaced apart by channel 120 which is covered by thin gate dielectric 122 in turn covered by gate electrode 124.

Vertical FET 108 has drain/source region 118 in common with lateral FET 106, as well as source/drain region 102 which is provided as an n+ buried layer. Source/drain regions 118 and 102 are separated by channel 126 in the wall 110 of trench 112. The channel 126 and trench wall 110 are covered by thin gate dielectric layer 128, which is in turn covered by gate electrode 130. Unlike the other embodiments discussed so far, gate dielectric layer 128 and conductive layer 130 are continuous around the shape of the trench and may be cylindrical or box-shaped. Thus, the isolation regions 16 should be spaced apart from the trench 112 on all sides, as shown in FIG. 12, so that current can move around the cell.

Further, the central load device 114 is a resistor comprising a lightly doped n⁻ polysilicon plug 132 capped by a n+ doped polysilicon contact 134. The bottom of resistor 114 contacts doped polysilicon interconnect layer 136 which in turn contacts n+ drain/source region 118 previously discussed. Interconnect layer 136 is insulated from the bulk of resistor 114 resistive polysilicon plug 132 by dielectric layer 138 and from vertical FET 108 gate 130 by dielectric layer 140. As with the other alternate embodiments of the invention, the processes and materials used to form the cell 100 in FIG. 10 are similar to those discussed with regard to FIGS. 4 through 7 and 1. However, it should be noted that the source/drain region 116 and drain/source region 118 in the FIG. 10 structure may be formed by self-aligned polysilicon gate processes, rather than by providing a photomask and pattern etching. It will be seen that self-aligned processes may also be used in the cells depicted in FIGS. 13 and 16, subsequently discussed.

Figure 11:
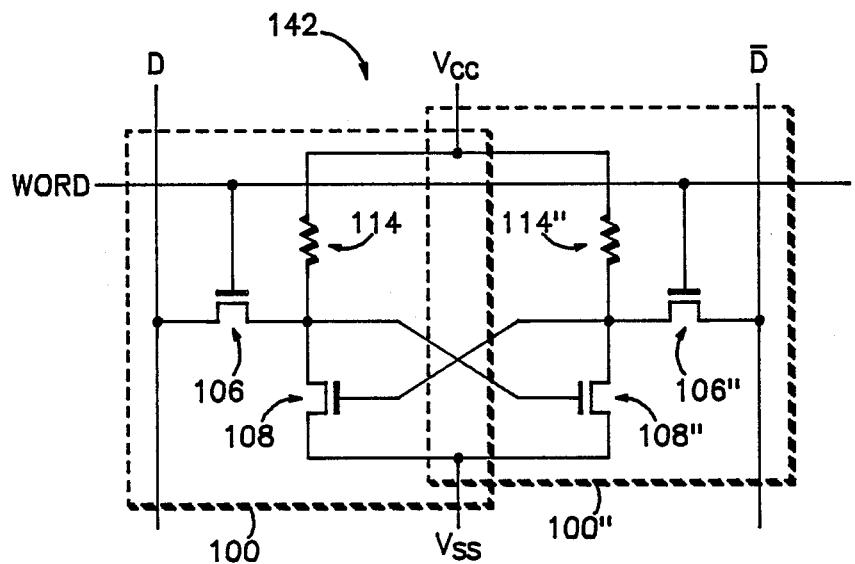
FIG. 11 is a schematic circuit diagram of another embodiment of the four transistor and two resistor SRAM cell illustrating how the alternate embodiment of FIG. 10 may be connected.

However, as might be expected, the cell 100 is configured somewhat differently in its layout and circuit diagram. Shown in FIG. 11 is the same four-transistor, two-resistor SRAM cell 142 shown in FIG. 9. However, in FIG. 11, lateral transistors 106 and 106" serve the functions of transistors 70 and 70", respectively, in the FIG. 9 circuit. Vertical transistors 108 and 108" in the FIG. 11 circuit serve the function of vertical FETs 72 and 72" of the FIG. 9 circuit; while resistors 114 and 114" of the FIG. 11 circuit serve the function of resistors 90 and 90" in the FIG. 9 circuit. Since this basic circuit has been discussed previously in detail, the present brief discussion will suffice for FIG. 11. Again the operation of SRAM cell 142 is well known in the art, since the circuit as depicted in FIG. 11 is not new, though its structural implementation is.

Figure 12:
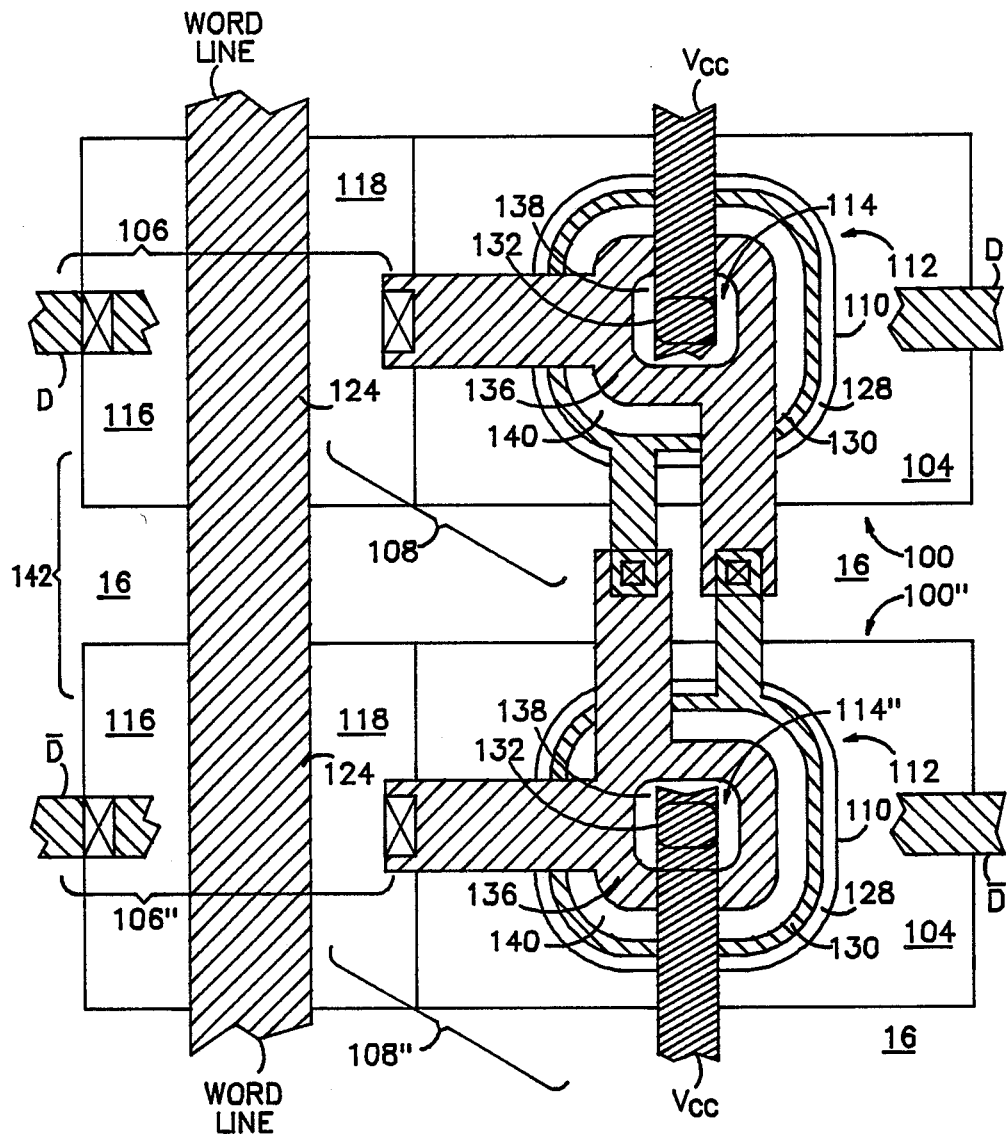
FIG. 12 is a rough, schematic layout view of the SRAM cell of FIG. 11.

Shown in FIG. 12 is a rough, schematic overhead layout of two cells 100 and 100" of the embodiment shown in FIG. 10 and interconnected as shown in FIG. 11. The same reference numerals used in FIGS. 10 and 11 are used in FIG. 12 for consistency and clarity between views. As with the layout shown in FIG. 2, it will be appreciated that the layout of FIG. 12 is not an optimized layout. For example, from FIG. 12 it is apparent that drain/source regions 118 could be positioned closer to trench 112 within the active area; and further that the isolation region 16 on the right side of cells 100 and 100" may be positioned appreciably closer to trench wall 110.

Briefly, the interconnections discussed above with respect to FIG. 11 will be reviewed with reference to FIG. 12. Note that source/drain region 116 of FET 106 is connected to bit line D, while source/drain region 116 of FET 106" is connected to complementary bit line D̄. The gates 124 for both FETs 106 and 106" are integral with the word line (which may, of course, be narrower than depicted). Drain/source region 118 of FET 106 is connected to interconnection conductive layer 136 of cell 100, which is in turn connected to gate electrode 130 of vertical FET 108" of cell 100". Similarly, drain/source region 118 of lateral FET 106", which is also a source/drain region for vertical FET 108", is connected to interconnection conductive layer 138 of cell 100", which in turn is connected to the gate electrode 130 of companion FET 108 of cell 100. Interconnection conductive layers 136 of both cells 100 and 100" are also connected to their respective load devices 114, the other ends of which are connected to common $V_{cc}$. The other source/drain regions 102 of FETs 108 of both cells 100 and 100" are the common n+ buried layer, which is connected to $V_{ss}$.

Figure 13:
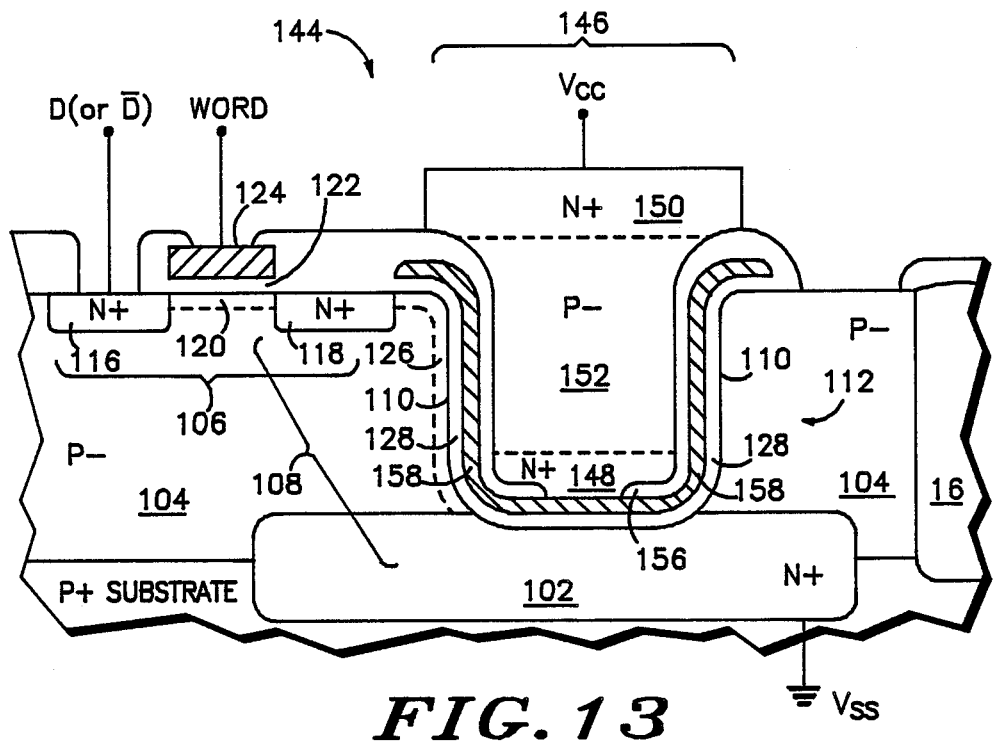
FIG. 13 is a cross-section illustration of still another embodiment of the invention which employs two vertical transistors and a lateral transistor on a substrate with a buried layer, where the two vertical FETs have common gates.

Shown in FIG. 13 is multiple transistor cell 144 which is similar to cell 100 depicted in FIG. 10, except that in this case the central load device 114 is a vertical FET 146. Most of the elements of cell 144 are similar to those of cell 100 and the reference numerals used are the same; these elements will not be discussed again for the sake of brevity. Second vertical FET 146 has a bottom source/drain region 148 and a top source/drain region 150, both regions 148 and 150 being n+ doped and separated by channel 152 which is p⁻ doped. Elements 148, 150 and 152 may be any suitable semiconductor material, such as polycrystalline silicon. The channel 152 is surrounded by thin gate dielectric layer 156, which in turn is surrounded by gate electrode 158, which again may be n+ doped polysilicon. As is apparent, gate electrode 158 is directly connected to bottom source/drain region 148. Further, gate electrode 158 not only is the gate electrode for second vertical FET 146, but is also the gate electrode for first vertical FET 108.

Figure 14:
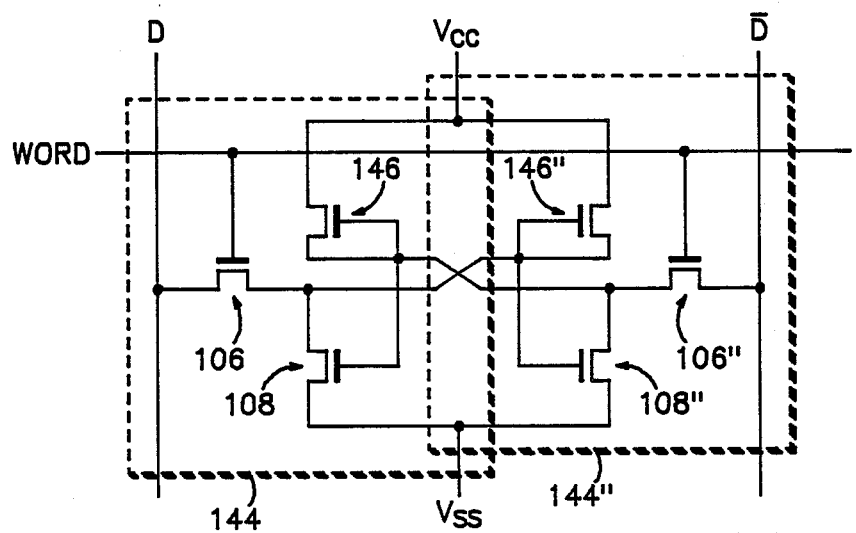
FIG. 14 is a schematic circuit diagram of another conventional six-transistor cell employing the multiple transistor cell of FIG. 13.

These differences in interconnections of the circuit elements prevent the utilization of cells 144 of FIG. 13 in the six-transistor SRAM cell circuit 56 of FIG. 3. Instead, when two multiple transistor cells 144 and 144" are interconnected to form the circuit of an SRAM cell 160, the circuit appears as shown in FIG. 14. Again the operation and function of this circuit is well known in the art, although the structure of the cells 144 and 144" is new.

Figure 15:
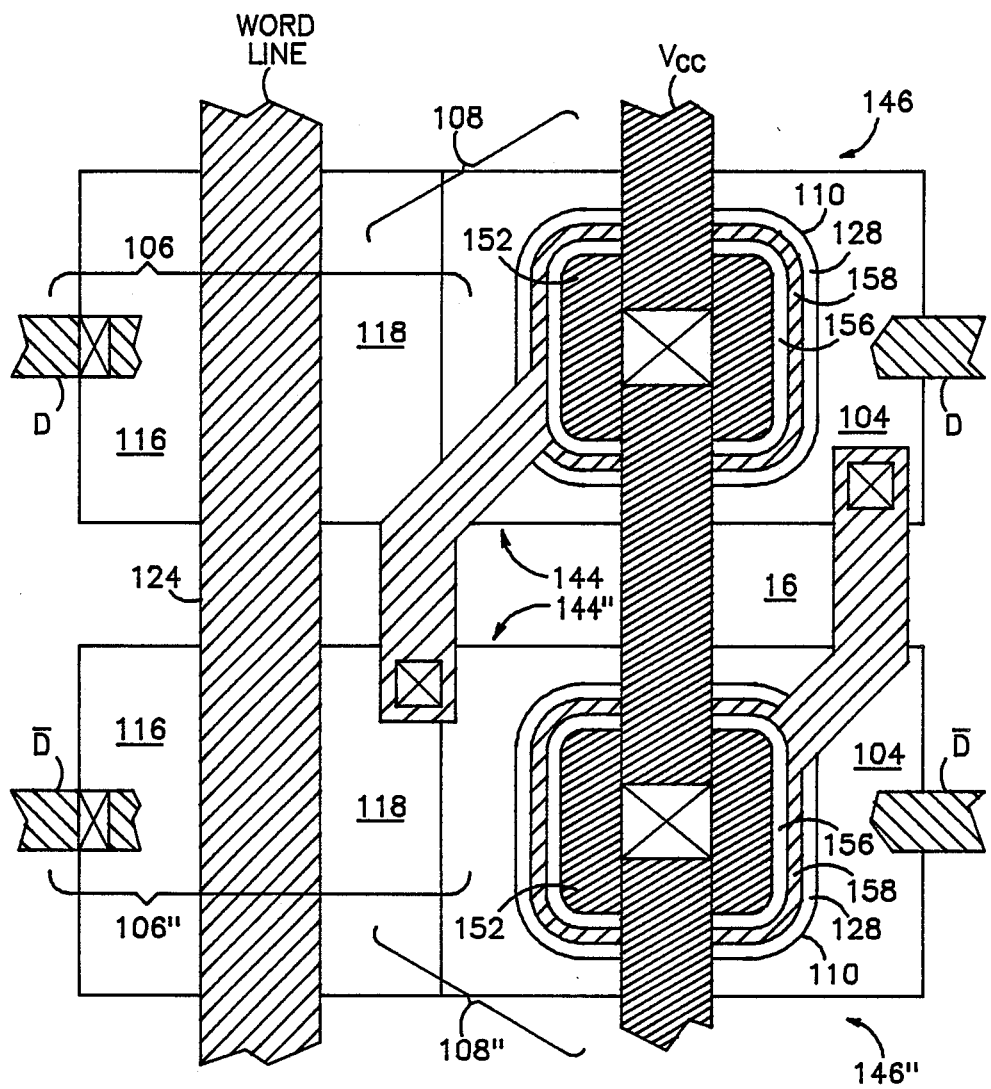
FIG. 15 is an approximate, schematic overhead layout of two cells of the embodiment shown in FIG. 13 and interconnected as shown in FIG. 14.

A rough, schematic layout of the six-transistor SRAM cell of FIG. 14 utilizing the multiple-component cells 144 and 144" of FIG. 13 is shown in FIG. 15. It will again be appreciated that the cells may not be laid out to best advantage with respect to space utilization. Nevertheless, it is expected that FIG. 15 may aid the reader in understanding the cells of FIG. 13, and thus, common reference numerals are used.

Thus, the multiple-component trench cells of the invention provide new structures for integrated circuit devices, particularly memories such as SRAMs. These cells require a minimum of lateral silicon area since they are built into the substrate. The soft error rate caused by stray alpha particles erroneously reading and writing wrong information into the cell is minimized since these trench cell structures offer possibilities of increasing the coupling capacitances of critical cell nodes and decreasing their junction area.

We claim:

1. An integrated circuit trench cell formed in a substrate, comprising:
   a trench having:
      at least one vertical wall;
      and a bottom floor;
      wherein the vertical wall has a top portion;
   at least one field effect transistor (FET) in the vertical wall, wherein the FET has:
      a source region and a drain region, one near the top portion of the wall and one in the bottom floor of the trench; and
      a gate region along the wall; and
   a central load device within the trench, wherein the central load device is an active load device having top and bottom contacts, wherein the bottom contact of the load device is electrically connected to the FET in the vertical wall.

2. The integrated circuit trench cell of claim 1, wherein the gate region and the central load device contain doped polycrystalline silicon.

3. The integrated circuit trench cell of claim 1 wherein the active load device is a load field effect transistor.

4. The integrated circuit trench cell of claim 3 wherein the load FET comprises a central vertical region having a top source/drain region, a bottom source/drain region, a channel region between the top and bottom source/drain regions, a gate dielectric covering the channel region, and a gate electrode at least partially covering the gate dielectric and oriented across the gate dielectric from the channel region, wherein the bottom source/drain region is in contact with the source/drain region in the bottom floor of the trench.

5. The integrated circuit trench cell of claim 1 where the source/drain region in the bottom floor of the trench consists of a semiconductor element selected from the group consisting of a doped semiconductor buried layer or a doped semiconductor wafer.

6. The integrated circuit trench cell of claim 1 wherein a channel is present between the source/drain region near the top portion of the wall and the one in the bottom floor of the trench, a thin gate dielectric layer is present on the trench wall and the gate region is present on the thin gate dielectric layer.

7. An integrated circuit trench cell formed in a substrate, comprising:
   a trench having:
      at least one vertical wall;
      and a bottom floor;
      wherein the vertical wall has a top portion;
   at least one field effect transistor (FET) in the vertical wall, wherein the FET has:
      a source region and a drain region, one near the top portion of the wall and one in the bottom floor of the trench; and
      a gate region along the wall;
   a central load device within the trench, the central load device having top and bottom contacts, wherein the bottom contact of the load device is electrically connected to the FET in the vertical wall; and
   a second lateral FET is present having a source/drain region in common with the source/drain region near the top portion of the trench wall.

8. The integrated circuit trench cell of claim 7 wherein the trench has at least two vertical walls, and an FET is present in at least two of the vertical walls.

9. An integrated circuit trench cell formed in a substrate, comprising:
   a trench having:
      at least two vertical walls; and
      a bottom floor;
      wherein each vertical wall has a top portion;
   at least two field effect transistors (FET), one each in two of the vertical walls wherein each FET has:
      two source/drain regions, one near the top portion of the wall and one in the bottom floor of the trench where the source/drain region in the bottom floor of the trench is common to both FETs; and
      a gate region along the wall; and
   a central load device within the trench between the FETs, the central load device having top and bottom contacts, wherein the bottom contact is in electrical connection with the common source/drain region in the bottom floor of the trench.

10. The integrated circuit of claim 9 wherein the gate regions and central load device are doped polycrystalline silicon.

11. The integrated circuit of claim 9 wherein the central load device is a resistor.

12. An integrated circuit trench cell formed in a substrate, comprising:
   a trench having:
      at least two vertical walls; and
      a bottom floor;
      wherein each vertical wall has a top portion;
   at least two field effect transistors (FET), one each in two of the vertical walls wherein each FET has:
      a source region and a drain region, one near the top portion of the wall and one in the bottom floor of the trench where the source/drain region in the bottom floor of the trench is common to both FETs; and
   a central load device within the trench between the FETs, wherein the central load device is a load field effect transistor having top and bottom contacts, wherein the bottom contact is in electrical connection with the common source/drain region in the bottom floor of the trench.

13. The integrated circuit of claim 12 wherein the load FET comprises a central vertical region having a top source/drain region, a bottom source/drain region, a channel region between the top and bottom source/drain regions, a gate dielectric covering the channel region, and a gate electrode at least partially covering the gate dielectric and oriented in across the gate dielectric from the channel region wherein the bottom source/drain region is in electrical contact with the common source/drain region in the bottom floor of the trench.

14. The integrated circuit trench cell of claim 9 where the source/drain region in the bottom floor of the trench consists of a semiconductor element selected from the group consisting of a doped semiconductor buried layer or a doped semiconductor wafer.

15. The integrated circuit trench cell of claim 9 wherein a channel is present between the source/drain region near the top portion of the wall and the one in the bottom floor of the trench, a thin gate dielectric layer is present on the trench wall and the gate region is present on the thin gate dielectric layer.

16. An integrated circuit trench cell formed in a substrate, comprising:
   a trench having:
      at least two vertical walls; and
      a bottom floor;
      wherein each vertical wall has a top portion;
   at least two field effect transistors (FET), one each in two of the vertical walls wherein each FET has:
      a source region and a drain region, one near the top portion of the wall and one in the bottom floor of the trench where the source/drain region in the bottom floor of the trench is common to both FETs; and
      a gate region along the wall;
   a central load device within the trench between the FET's the central load device having top and bottom contacts, wherein the bottom contact is in electrical connection with the common source/drain region in the bottom floor of the trench; and
   wherein a second lateral FET is present having a source/drain region in common with one of the source/drain regions near the top portion of the trench wall.

17. A integrated circuit trench cell formed in a face of a semiconductor substrate comprising:
   a trench having at least two vertical walls, each with a top edge, and a bottom floor within the face of the semiconductor substrate;
   a field effect transistor (FET) formed on at least two of the vertical walls of the trench, each FET having:
      a first common source/drain region in the bottom floor of the trench;
      a second source/drain region in the face of the semiconductor substrate near the top edge of the wall on which it is formed;
      a thin gate dielectric on the wall;
      a gate electrode over the thin gate dielectric; and
      a channel between the first source/drain region and the second source/drain region in the substrate covered by the gate electrode; and
   a vertical load device within the trench, the vertical load device having a top contact and a bottom contact wherein the bottom contact is in electrical connection with the first common source/drain region in the bottom floor of the trench, and wherein the load device is selected from the group consisting of a resistor and a field effect transistor.

18. An integrated circuit trench cell formed in a substrate, comprising:
   a trench having:
      at least one vertical wall; and
      a bottom floor;
      wherein the vertical wall has a top portion;
   at least one vertical field effect transistor (FET) in the vertical wall, wherein the FET has:
      two source/drain regions, one near the top portion of the wall and one in the bottom floor of the trench; and
      a gate region along the wall; and
   a central load transistor within the trench, the central load transistor having a top source/drain region and a bottom drain/source region with a channel region between them; wherein the bottom drain/source region is in electrical contact with the gate region of the vertical FET.

19. The integrated circuit trench cell of claim 18 wherein the gate region of the vertical FET is also the gate region for the central load transistor.

* * * * *